(12) United States Patent
Koh

(10) Patent No.: US 7,192,837 B2
(45) Date of Patent: Mar. 20, 2007

(54) METHODS OF MANUFACTURING MOSFET DEVICES

(75) Inventor: Kwan Ju Koh, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/765,027

(22) Filed: Jan. 26, 2004

(65) Prior Publication Data
US 2004/0157421 A1    Aug. 12, 2004

(30) Foreign Application Priority Data
Feb. 4, 2003    (KR) .................... 10-2003-0006830

(51) Int. Cl.
*H01L 21/8234*    (2006.01)
(52) U.S. Cl. .................. 438/299; 438/301; 438/306
(58) Field of Classification Search ................ 438/299, 438/300, 306, 229, 301, 585
See application file for complete search history.

(56) References Cited

U.S. PATENT DOCUMENTS

| | | | | |
|---|---|---|---|---|
| 4,830,975 A | * | 5/1989 | Bovaird et al. | 438/589 |
| 5,583,064 A | * | 12/1996 | Lee et al. | 438/300 |
| 5,817,558 A | * | 10/1998 | Wu | 438/291 |
| 6,054,355 A | * | 4/2000 | Inumiya et al. | 438/296 |
| 6,127,699 A | * | 10/2000 | Ni et al. | 257/330 |
| 6,309,933 B1 | * | 10/2001 | Li et al. | 438/291 |
| 6,465,842 B2 | * | 10/2002 | Nishinohara | 257/330 |
| 6,642,130 B2 | * | 11/2003 | Park | 438/589 |

* cited by examiner

*Primary Examiner*—Michael Trinh
(74) *Attorney, Agent, or Firm*—Andrew D. Fortney

(57) ABSTRACT

Example methods of manufacturing MOSFET devices are disclosed. One example method may include an oxidation, an etching, an ion implanting for a threshold voltage control to form an elevated source/drain region and thereby implements an ultra shallow junction.

17 Claims, 3 Drawing Sheets

METHODS OF MANUFACTURING MOSFET DEVICES

TECHNICAL FIELD

The present disclosure relates to semiconductor devices and, more particularly, to methods of manufacturing metal oxide semiconductor field effect transistor (MOSFET) devices.

BACKGROUND

Generally, a gate of a MOSFET device is composed of a polysilicon material. Polysilicon is used because it satisfies a material feature required for a gate material, such as a high melting point, ease in forming a thin film and a line pattern, stability in an acidic environment, and a conformal surface thereof. Additionally, in an actual MOSFET device, the gate made of the polysilicon shows a low resistance because it contains a dopant such as, for example, phosphorous, arsenic, and/or boron.

However, as a level of integration of the MOSFET increases, there are limitations and drawbacks for implementing a resistance that is required between a narrow linewidth.

Using a conventional method for manufacturing a MOSFET device, it is difficult to form an ultra shallow junction that is required to a highly integrate MOSFET devices. Therefore, MOSFET fabrication requires a process technology to form an elevated source/drain region. Further, a control of a threshold voltage cannot be stabilized in the MOSFET device due to transformation of an implanted dopant array by an accompanying heat process.

DETAILED DESCRIPTION

Figure 1A:
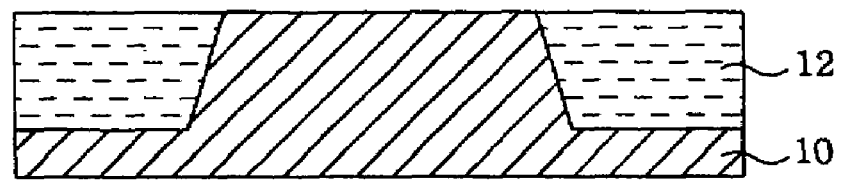
FIGS. 1A to 1H illustrate an example disclosed procedure for manufacturing MOSFET devices.

Referring to FIG. 1A, a shallow trench isolation (STI) 12 is selectively formed in an upper portion of a silicon substrate 10.

Figure 1B:
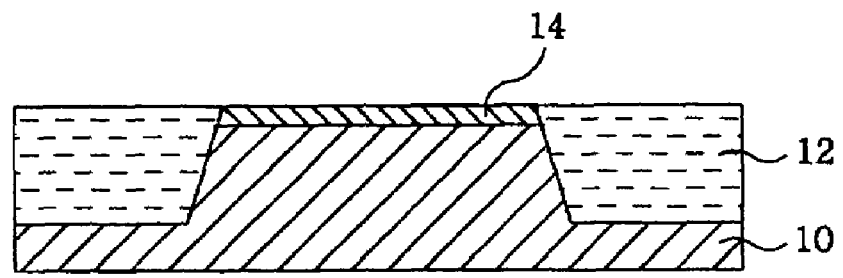

Referring to FIG. 1B, after a surface of an active area of the substrate 10 is oxidized to form an oxide layer 14, a dopant is lightly implanted to thereby form a lightly doped drain (LDD) around the active area of the substrate 10. Herein, a density of LDD can be varied.

Figure 1C:
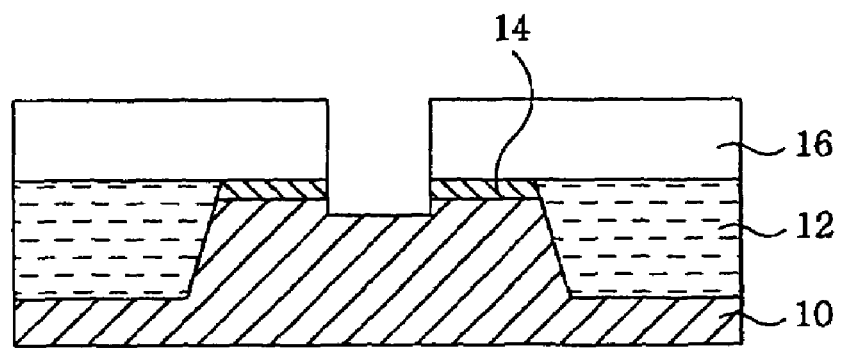

Referring to FIG. 1C, a nitride layer 16 is deposited on an entire surface of a structure of FIG. 1B. Areas of the nitride layer 16 and the oxide layer 14 where a gate will be located are removed, and the substrate 10 corresponding to the area is also etched by a predetermined depth. Herein, the substrate 10 is etched by about 200 angstroms to 1000 angstroms in depth so that a hole for the gate is formed.

Figure 1D:
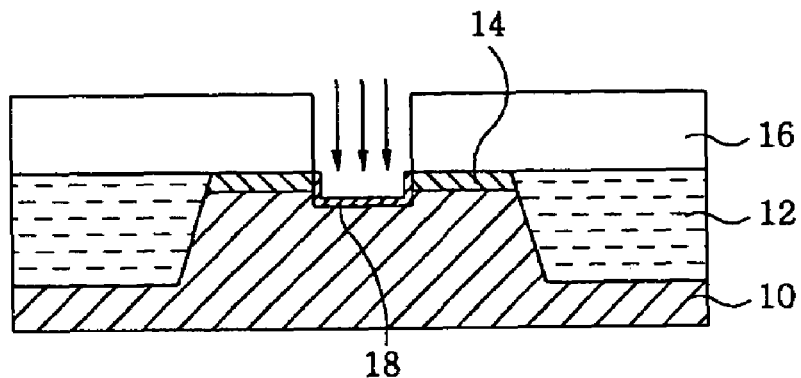

Referring to FIG. 1D, the exposed portion of the substrate 10 in the hole for the gate is oxidized at about 600 to 800° C. to form an oxide layer 18 having a thickness of about 100 angstroms. Ions are then implanted through the oxide layer 18 into the substrate 10. The oxide layer 18 prevents the substrate 10 from being damaged during the ion implanting for control of a threshold voltage.

Figure 1E:
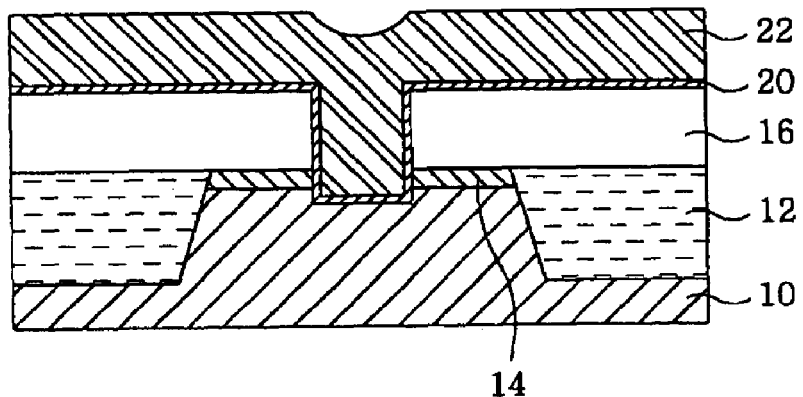

Referring to FIG. 1E, the oxide layer 18 is removed and a gate insulating layer 20 is deposited over all the surface of the structure. Then the hole of the structure is filled with a polysilicon 22.

Figure 1F:
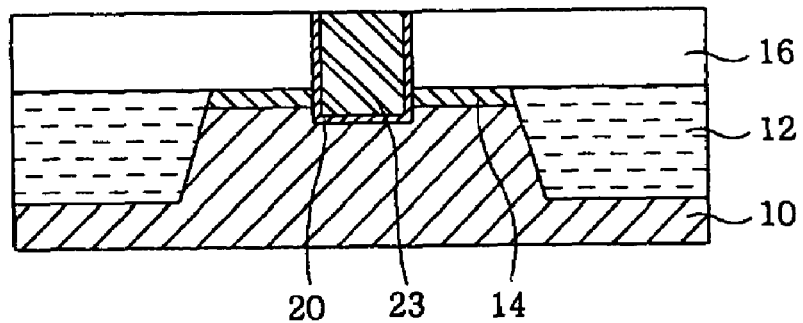

Referring to FIG. 1F, a chemical mechanical polishing process is performed until the nitride layer 16 is exposed. In the result, a polysilicon gate 23 filling the hole for the gate is formed.

Figure 1G:
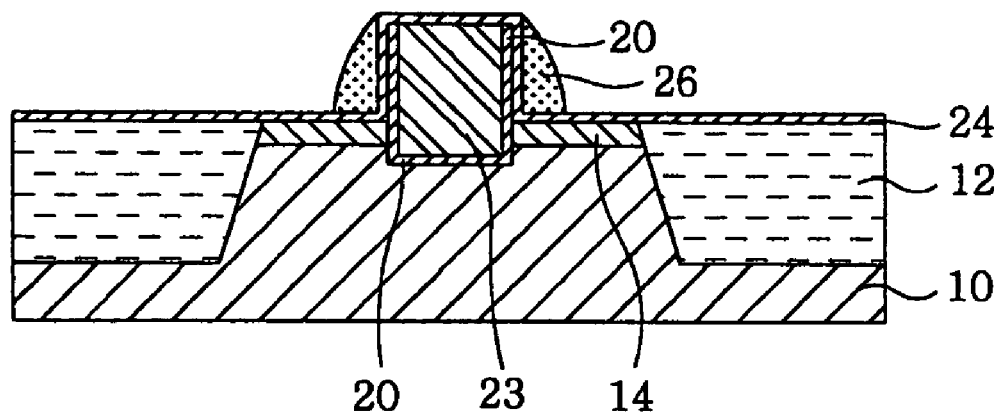

Referring to FIG. 1G, the nitride layer 16 is removed by a wet etch and then an oxide layer 24 is formed thereon. Thereafter, a nitride layer is deposited on the oxide layer 24 and then etched back to form a gate sidewall 26 around the polysilicon gate 23.

Figure 1H:
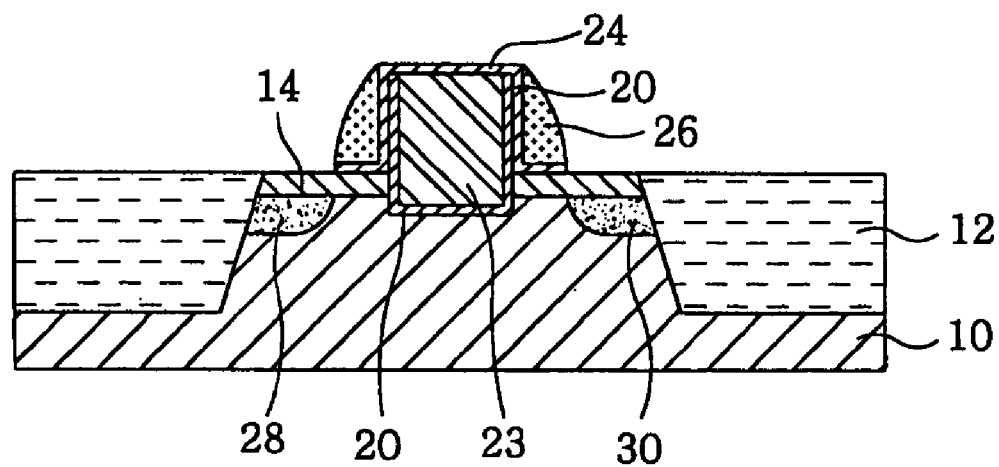

Referring FIG. 1H, ions are implanted to form a source 28 and a drain 30 at both sides of the polysilicon gate 23 and the oxide layer 24 exposed by the etch back is removed to complete a MOSFET device.

As described above, an ultra shallow junction may be forming by elevating a source/drain region. The disclosed process may be used to manufacture a non-volatile memory device that is appropriate to form a self-align flash memory.

As disclosed herein, one example method may include (a) selectively forming a shallow trench isolation in a substrate; (b) forming a first oxide layer on a surface of an active region of the substrate and implanting ions thereinto for forming a low doped drain in the active region; (c) forming a nitride layer; (d) removing a part of the nitride layer and the oxide layer where a gate will be located and etching the substrate corresponding to the part by a predetermined depth; (e) forming a second oxide layer over an exposed portion of the substrate; (f) implanting ions into the substrate; (g) removing the second oxide layer; (h) depositing a gate insulating layer and a polysilicon; (i) polishing until the nitride layer is exposed; (j) removing the nitride layer, depositing an oxide layer conformally and depositing an nitride layer; (k) etching the nitride layer to form a gate sidewall of nitride; (l) implanting ions into the substrate to form a source and drain at both sides of the gate; and (m) removing an exposed oxide layer.

Although certain example methods have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a MOSFET device, the method comprising:

forming a shallow trench isolation in a substrate;

farming a first oxide layer on a surface of an active region of the substrate and implanting ions thereinto for forming a lightly doped drain in the active region prior to the formation of a gate;

forming a first nitride layer;

removing a part of the first nitride layer and the first oxide layer and etching the substrate corresponding to the part, including the tightly doped drain, by a depth of about 200 to about 1000 angstroms to define a gate region;

forming a second oxide layer aver an exposed portion of the substrate;

implanting ions into the substrate;

removing the second oxide layer;

depositing a gate insulating layer and a polysilicon layer into the removed parts of the first nitride layer and the first aid do layer;

polishing until the first nitride layer is exposed;

removing the first nitride layer, depositing an oxide layer conformally and depositing a second nitride layer;

etching the second nitride layer to form a gate sidewall;

implanting ions into the substrate to form a source and drain at locations which are deeper than that of the lightly doped drain and at sides of the gate; and removing an exposed oxide layer.

2. A method as defined by claim 1, wherein the substrate comprises a silicon substrate.

3. A method as defined by claim 1, wherein the shallow trench isolation comprises an oxide layer.

4. A method as defined by claim 1, wherein forming the second oxide layer comprises oxidizing the exposed substrate at a temperature of from about 600 to about 800° C., such that the second oxide layer has a thickness of about 100 angstroms.

5. A method as defined by claim 1, wherein the polishing comprises chemical mechanical polishing.

6. A method as defined by claim 1, wherein removing the second nitride layer comprises etch back processing.

7. A method for manufacturing a MOSFET device, the method comprising:

implanting ions into an active region of a substrate to form a lightly doped drain (LDD) prior to forming a gate;

forming a first nitride layer on the substrate, including the active region;

removing a part of the first nitride layer and etching to exposed substrate, including the LDD, to a predetermined depth to define a gate region;

implanting ions into the substrate to control a voltage threshold of the MOSFET device;

forming a gate insulating layer and a polysilicon layer in the gate region;

removing to first nitride layer, then depositing an oxide layer and a second nitride layer on to polysilicon layer;

etching the second nitride layer to form a gate sidewall; and implanting ions into the substrate to form a source and drain at locations which are deeper than that of the LDD and at sides of the gate.

8. A method as defined by claim 7, wherein the substrate comprises a silicon substrate.

9. A method as defined by claim 7, further comprising forming a shallow trench isolation in the substrate to define the active region prior to implanting ions to form a LDD.

10. A method as defined by claim 9, wherein the shallow trench isolation comprises an oxide layer.

11. A method as defined by claim 7, wherein forming the polysilicon layer comprises depositing polysilicon onto the gate insulating layer in the gate region and chemical mechanical polishing the polysilicon.

12. A method as defined by claim 11, wherein forming the gate insulating layer comprises depositing the gate insulating layer in the gate region.

13. A method as defined by claim 7, wherein removing the second nitride layer comprises etch back processing.

14. A method as defined by claim 7, wherein the predetermined depth is from about 200 to about 1000 angstroms.

15. A method as defined by claim 7, further comprising, prior to implanting ions into the substrate to control the voltage threshold of the MOSFET device, forming a second oxide layer over an exposed portion of the substrate.

16. A method as defined by claim 15, further comprising, after implanting ions into the substrate to control the voltage threshold or the MOSFET device, removing the second oxide layer.

17. A method as defined by claim 7, further comprising, after implanting ions into the substrate to form the source and drain, removing an exposed oxide layer.

* * * * *

UNITED STATES PATENT AND TRADEMARK OFFICE
CERTIFICATE OF CORRECTION

PATENT NO. : 7,192,837 B2  Page 1 of 1
APPLICATION NO. : 10/765027
DATED : March 20, 2007
INVENTOR(S) : Kwan Ju Koh It is certified that error appears in the above-identified patent and that said Letters Patent is hereby corrected as shown below:

IN THE CLAIMS

Column 2, line 46 of the issued patent: change "farming a first oxide layer" to --forming a first oxide layer--.

Column 2, line 54 of the issued patent: change "including the tightly doped drain" to --including the lightly doped drain--.

Column 2, line 57 of the issued patent: change "second oxide layer aver an exposed portion" to --second oxide layer over an exposed portion--.

Column 2, line 62 of the issued patent: change "first aid do layer" to --first oxide layer--.

Column 3, lines 24-25 of the issued patent: change "etching to exposed substrate" to --etching the exposed substrate--.

Column 3, line 31 of the issued patent: change "removing to first nitride layer" to --removing the first nitride layer--.

Column 3, line 32 of the issued patent: change "to polysilicon layer" to --the polysilicon layer--.

Signed and Sealed this

Twenty-eighth Day of July, 2009

JOHN DOLL
*Acting Director of the United States Patent and Trademark Office*